United States Patent
Feiweier

(10) Patent No.: US 9,599,690 B2
(45) Date of Patent: Mar. 21, 2017

(54) MAGNETIC RESONANCE SYSTEM AND METHOD FOR REPHASING SPIN SYSTEMS IN SLICES IN SLICE MULTIPLEXING MEASUREMENT SEQUENCES FOR MAGNETIC RESONANCE IMAGING

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 1187 days.

(21) Appl. No.: 13/602,686

(22) Filed: Sep. 4, 2012

(65) Prior Publication Data

US 2013/0057280 A1 Mar. 7, 2013

(30) Foreign Application Priority Data

Sep. 1, 2011 (DE) ........................ 10 2011 082 010

(51) Int. Cl.
*G01R 33/565* (2006.01)
*G01R 33/483* (2006.01)

(52) U.S. Cl.
CPC ........ *G01R 33/4835* (2013.01); *G01R 33/565* (2013.01)

(58) Field of Classification Search
USPC ............................ 324/300–322; 600/407–435
See application file for complete search history.

(56) References Cited

U.S. PATENT DOCUMENTS

| | | | | |
|---|---|---|---|---|
| 2,832,061 | A | * | 4/1958 | Walker .................... G11C 11/16 324/312 |
| 2,977,465 | A | * | 3/1961 | Sanders, Jr. ............. H03J 7/22 324/76.26 |
| 5,422,572 | A | | 6/1995 | Yao |
| 5,578,924 | A | | 11/1996 | Dumoulin et al. |
| 5,745,437 | A | * | 4/1998 | Wachter .................. G01S 17/36 342/127 |
| 8,395,385 | B2 | | 3/2013 | Lee et al. |

(Continued)

FOREIGN PATENT DOCUMENTS

KR 20110075859 A 7/2011

OTHER PUBLICATIONS

"Use of Multicoil Arrays for Separation of Signal from Multiple Slices Simultaneously Excited," Larkman et al., Journal of Magnetic Resonance Imaging, vol. 13 (2001), pp. 313-317.
"Simultaneous Echo Refocusing in EPI," Feinberg et al., Magnetic Resonance in Medicine, vol. 48 (2002), pp. 1-5.
"Efficient Design of Pulses with Trapezoidal Magnitude and Linear Phase Response Profiles," Pickup et al., Magnetic Resonance in Medicine, vol. 38 (1997), pp. 137-145.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method for rephasing a first spin system in a first slice with a first coherence curve and a second spin system of a second slice with a second coherence curve, in the generation of MR images with slice multiplexing, a first RF pulse deflects the spin system of the first slice and a second RF pulse deflects the spin system of the second slice. The beginning of the second RF pulse is time-shifted with respect to the beginning of the first RF pulse by a time period that is shorter than the duration of the first RF pulse. A rephasing correction impresses a correction phase on at least one of the spin systems, and signals of the spin systems are respectively detected. The coherence curves are rephased so detection of the signals occurs simultaneously.

16 Claims, 10 Drawing Sheets

(56) References Cited

U.S. PATENT DOCUMENTS

| | | | |
|---|---|---|---|
| 8,941,381 B2* | 1/2015 | Feinberg | G01R 33/4835 324/307 |
| 2002/0135366 A1 | 9/2002 | Heubes | |
| 2005/0017719 A1 | 1/2005 | Heubes | |
| 2007/0249929 A1 | 10/2007 | Jeong et al. | |
| 2008/0278159 A1 | 11/2008 | Park | |
| 2009/0230957 A1 | 9/2009 | Park | |
| 2010/0237864 A1 | 9/2010 | Stemmer | |
| 2010/0259260 A1 | 10/2010 | Lee et al. | |
| 2012/0056620 A1* | 3/2012 | Feinberg | G01R 33/4835 324/309 |
| 2013/0057280 A1* | 3/2013 | Feiweier | G01R 33/4835 324/309 |
| 2013/0057281 A1* | 3/2013 | Feiweier | G01R 33/4835 324/309 |

OTHER PUBLICATIONS

"Wideband MRI: A New Dimension of MR Image Acceleration," Wu et al., Proc. Intl. Soc. Mag. Reson. Med., vol. 17 (2009), p. 2678.

"SIMA: Simultaneous Multislice Acquisition of MR Images by Hadamard-Encoded Excitation," Souza et al., Journal of Computer Assisted Tomography, vol. 12, No. 6 (1988), pp. 1026-1030.

"Blipped CAIPIRHINA for simultaneous multi-slice EPI with reduced g-factor penalty," Setsompop et al., ISMRM-ESMRMB Joint Annual Meeting 2010, vol. 2 of 6, p. 1111.

"Multiplexed Echo Planar Imaging for Sub-Second Whole Brain FMRI and Fast Diffusion Imaging," Feinberg et al., PLoS One, vol. 5, Issue 12 (2010), e15710, pp. 1-11.

* cited by examiner

MAGNETIC RESONANCE SYSTEM AND METHOD FOR REPHASING SPIN SYSTEMS IN SLICES IN SLICE MULTIPLEXING MEASUREMENT SEQUENCES FOR MAGNETIC RESONANCE IMAGING

BACKGROUND OF THE INVENTION

Field of the Invention

The present invention concerns a method for rephasing a first spin system in a first slice with a first coherence curve and a second spin system of a second slice with a second coherence curve in the generation of magnetic resonance (MR) images, and a magnetic resonance system designed to implement such a method. In particular, the invention concerns the rephasing of spin systems in slice multiplexing measurement sequences.

Description of the Prior Art

Magnetic resonance tomography is an imaging method that is used for examination and diagnosis in many fields of medicine. The phenomenon of nuclear magnetic resonance forms the basis of this technique. To acquire MR signals, a static basic magnetic field is generated in the examination region at which the nuclear spins (magnetic moments) of the atoms in the examination subject align. The nuclear spins can be deflected or excited out of the aligned position (i.e. the idle state) or a different state by radiating the radio-frequency pulses. The relaxation back into the idle state generates a decay signal that can be inductively detected by one or more reception coils.

The phase evolution of the spin system of a slice is described by the coherence curve (progression). If the spins of a spin system of a specific slice all have an identical phase position, this is known as a disappearing dephasing of the coherence curve. A signal can be detected since no destructive interference exists between the signals of various spins of different phase.

By applying a slice selection gradient upon radiation of the radio-frequency pulses, nuclear spins are excited only in a slice of the examination subject in which the resonance condition due to the local magnetic field strength is satisfied. An additional spatial coding can take place by the application of at least one phase coding gradient, and a frequency coding gradient can be activated during the readout. It is thereby possible to acquire MR exposures of multiple slices of an examined person. With suitable presentation methods, it is possible to provide a 3-dimensional (3D) image of a specific region of the examined person for diagnosis.

In the clinical environment there is always a quest for faster MR acquisitions, in particular 3D acquisitions. MR measurement sequences to generate MR exposures can be optimized in this regard. In particular, MR sequences in which images are acquired simultaneously from multiple slices, i.e. what are known as slice multiplexing measurement sequences, are suitable for this purpose. In general, slice multiplexing measurement sequences can be characterized by a transverse component of the magnetization of at least two slices being specifically used simultaneously for the imaging process, at least during a portion of the measurement. By contrast, in the usual multislice imaging, the signal of at least two slices is acquired in alternation, i.e. completely independently of one another and with a correspondingly longer measurement time (known as "interleaved" measurement sequences).

Various slice multiplexing measurement sequences are known. For example, given simultaneous excitation of the magnetization and/or simultaneous detection of an MR signal the addressing of the various slices can take place via a phase coding (what is known as "Hadamard" coding; see S. P. Souza et al. in J. Comput. Assist Tomogr. 12 (1988) 1026) or a frequency coding (what is known as "broadband data acquisition"; see E. L. Wu et al. in Proc. Intl. Soc. Mag. Reson. Med. 17 (2009) 2678).

Furthermore, there are MR measurement sequences that use multiple radio-frequency coils to differentiate various slices. With knowledge of the spatial acquisition characteristic of the different radio-frequency coils, the simultaneously acquired data can be separated by means of suitable computing operations. Such methods are known under the names SENSE, GRAPPA or SMASH, for example.

In the simultaneous application of multiple radio-frequency pulses to deflect the magnetization (meaning that the magnetization of various slices is simultaneously affected by means of radio-frequency pulses), although the time required to implement the measurement sequence is shortened, the required peak power of the radio-frequency alternating electromagnetic field is simultaneously increased. This increases the specific absorption rate (SAR) in the examined person and is generally not desired. In this context U.S. Pat. No. 5,422,572 discloses a method of parallel MR imaging in which various slice-selective radio-frequency (RF) pulses are essentially applied simultaneously, but with a slight time shift relative to one another. Both the measurement time and the required peak RF power can thereby be reduced.

It should be noted that the time shift of the RF pulses results in differences in the temporal evolution of the magnetization (coherence curve). In order to ensure a simultaneous data acquisition, the coherence curve of the spin systems of the various slices must be rephased at the point in time of the data acquisition.

In simultaneous acquisition of MR data from multiple slices, it is accordingly desirable to rephase the coherence curves of the corresponding spin systems at the point in time of the data acquisition.

SUMMARY OF THE INVENTION

An object of the present invention is to provide an improved MR slice multiplexing measurement sequence for rephasing of the coherence curves of the spin systems.

According to one aspect of the invention, a method is provided for rephasing a first spin system in a first slice with a first coherence curve and a second spin system of a second slice with a second coherence curve given generation of MR images with slice multiplexing. The method includes the following steps of applying a first radio-frequency pulse to deflect the spin system of the first slice, applying a second radio-frequency pulse to deflect the spin system of the second slice, and time-shifting the beginning of the second radio-frequency pulse by a first difference time period (which is shorter than the duration of the first radio-frequency pulse) relative to the beginning of the first radio-frequency pulse.

Furthermore, a rephasing correction step is implemented to impress a correction phase on at least one of the two spin systems. Furthermore, a detection step is implemented to detect respective first and second signals of the magnetization of the first and second spin systems in a signal detection time period. The rephasing correction step is designed so that the first and second coherences curve are rephased so that the detection of the first and second signals occurs simultaneously in the signal detection time period.

Deflection of the magnetization means either deflection of the magnetization out of the idle state or deflection of the magnetization out of a dynamic state. For example, by means of radio-frequency excitation pulses it is possible to deflect the magnetization out of the idle state. However, it is also possible (for example by means of radio-frequency refocusing pulses) to deflect the magnetization out of a state of dynamic dephasing, for instance, and to produce a rephasing.

This has the advantage that a simultaneous readout of the signal of the various slices is possible according to MR slice multiplexing. Slice multiplexing measurement sequences that are known in the literature can be directly applied. This has the advantage of a shortened measurement time duration and a reduced RF pulse amplitude (and therefore radio-frequency exposure of the examined person) by the partial temporal overlapping of the first and second radio-frequency pulse.

The first radio-frequency pulse and the second radio-frequency pulse at least partially temporally overlap. Therefore, an additional advantage is due to the fact that it is possible to have a magnetic field gradient for slice selection have an effect without interruption during the application of the first and second radio-frequency pulse. Magnetic field gradients as described above are used to produce a spatial coding of the deflection of the spin systems in interaction with RF pulses. A magnetic field gradient is typically switched (activated) during the application of an RF pulse so that the resonance condition for the excitation frequency of the RF pulse has only been satisfied for a specific location along the magnetic field gradient. According to the invention, the magnetic field gradient does not need to be switched on or off between two RF pulses. Compared to established methods of multislice imaging the exposure by alternating electromagnetic fields decreases because of the only one-time application of a magnetic field gradient for the deflection of multiple slices.

It is possible to implement an MR measurement sequence according to the invention for imaging of more than two slices. The described features can be transferred to the imaging of three or more slices.

The first difference time period can be determined according to at least one of the following criteria: duration of the MR imaging, amplitude of the radio-frequency pulses, signal strength. If the first difference time period is selected to be longer—meaning that the temporal overlap of the first and second radio-frequency pulse decreases—the duration of the MR imaging increases. At the same time, the required amplitude of the radio-frequency pulses decreases in order to achieve an identical deflection of the magnetization. The signal strength of the detected signal can typically coincide with the deflection amplitude of the magnetization, meaning that—given the same amplitude of the radio-frequency pulses and increased first difference time period (longer duration of the MR imaging)—it is possible to achieve an increased signal strength. One of these criteria can be significant in the establishment of the first difference time period.

For example, there are MR measurement sequences that have a duration in the range of a few tens of milliseconds. A partial parallelization of the RF pulses can be achieved via the suitable determination of the first difference time period. The measurement time duration thus can be significantly shortened, i.e. by a few percent. The operation of a correspondingly configured MR system is particularly economical.

Furthermore, it is possible to calculate the correction phase from at least one of the following criteria: first difference time period, first coherence curve, second coherence curve. The correction phase according to the present invention has the effect that the first and second signal can be read out simultaneously in the signal detection time period. Therefore, the correction phase must be dimensioned correctly.

A parameter that can enter into the dimensioning of the correction phase is the first difference time period. The longer that the first difference time period is chosen to be, the more different that the first or second coherence curve can be. This can result in a larger necessary correction phase. At the same time, the correction phase can be corrected with direct knowledge of the first or second coherence curve. It should be noted that the correction phase also need not be dependent on the first difference time period, as is explained further below.

It can be advantageous for the RF pulses to have a time curve of the amplitude that is asymmetrical relative to the point in time of the maximum amplitude of the respective RF pulse.

Given a partial temporal overlapping of, for example, excitation pulses or refocusing pulses, an asymmetrical curve of the amplitude can have the effect that the required peak RF power can be further reduced in comparison to symmetrical RF excitation pulses given identical time separation. In each case, an asymmetrical curve of the amplitude allows the offset of the temporal evolution of the coherence curves of the associated spin systems to be minimized, and therefore the correction phase can be of smaller dimension.

The rephasing correction step can furthermore embody a design the first or second RF pulse so that at least a portion of the correction phase is impressed by an amplitude modulation during the application of the radio-frequency pulses. In the literature, for example, such a method is known (S. Pickup and M. Popescu in Magnetic Resonance in Medicine 38 (1997) 137-145) that allows the dependency of the phase (the coherence curve) impressed by the pulse on the magnetization to be determined via an RF excitation pulse or refocusing pulse. Due to specific embodiment of the RF pulses, a rephased coherence curve can already be achieved via an amplitude modulation after application of the RF pulse.

Furthermore, the rephasing correction step can include the application of a correction magnetic field gradient. The introduction of a correction phase or a portion of the correction phase can be produced in the coherence curve via the switching of a correction magnetic field gradient. A different correction phase can be generated in different slices, for example, depending on the temporal arrangement of the correction magnetic field gradient in relation to RF pulses. This is explained in detail below.

It is also possible for the correction magnetic field gradient to have a nonlinear spatial dependency. Magnetic field gradients are typically designed so that they have a linear spatial dependency, meaning that the dependency of the magnetic field gradient strength on the location is at least approximately described by a linear function.

It is also possible to generate a nonlinear (for example quadratic) spatial dependency of the magnetic field gradient. A different coherence curve can be rephased in each excited slice along a slice selection direction that is defined by the changing correction magnetic field gradient. The nonlinear spatial dependency can be achieved, for example, by an additional switchable field coil or multiple field coils with a nonlinear field curve.

The correction phase impressed by a nonlinear magnetic field gradient is dependent on the position of the respective slice along the direction of the nonlinearity of the magnetic field gradient. For example, a magnetic field gradient can be used that is described by a quadratic function. In particular, by suitable dimensioning of the linear and quadratic portion it can hereby be achieved that the curve of the magnetic field gradients can be described in good approximation via a linear function in proximity to the relevant slices. This ensures an easily manageable temporal evolution of the coherence curve over the entire slice thickness. The effective active magnetic field gradient, or the effective impressed correction phase is then slice-specific. The coherence curves of two or more slices can be simultaneously rephased in this way.

For example, the first radio-frequency pulse can be a first refocusing pulse to generate a spin echo in the first slice, and the second radio-frequency pulse can be a second refocusing pulse to generate a spin echo in the second slice. Refocusing pulses are typically used in MR imaging in order to produce a rephasing of the spin system after a dephasing of the spin system. It can be advantageous according to the present invention for the refocusing pulses to have a partial temporal overlap.

Furthermore, the method according to the present invention can include exciting the first spin system out of the idle state with a first excitation pulse; exciting the second spin system out of the idle state with a second excitation pulse; with the beginning of the second excitation pulse being shifted by a second difference time period relative to the beginning of the first excitation pulse.

Preferably, the second difference time period is shorter than the duration of the first excitation pulse. The excitation pulses can thus partially temporally overlap. A partial temporal overlapping decreases the duration that is required for MR imaging, and decreases the required peak RF power for the excitation pulses, as has been explained in detail.

It is also possible for the second difference time period to be longer than the duration of the first excitation pulse. According to the invention, it is then possible to specifically affect the magnetization of the first slice between the first and second excitation pulse. The magnetization of the second slice has still not yet been deflected out of the idle state at the point in time directly after the first excitation pulse and before the second excitation pulse. A magnetic field gradient that is then switched affects only the already excited spins of the first slice. At the same time, it can be ensured that slice multiplexing measurement sequences can be applied due to the simultaneous detection of the first and second signal in the signal detection time period. A significant time reduction of the measurement duration is still present relative to the conventional sequential method for imaging of multiple slices.

According to the present invention a first correction magnetic field gradient can be activated between the first and second excitation pulses, and a second correction magnetic field gradient can be activated either between the second excitation pulse and the refocusing pulses, or after the refocusing pulses and before the detection (readout). If the first and the second excitation pulses are completely temporally separated, meaning that the second difference time period is longer than the duration of the first excitation pulse, a correction magnetic field gradient can be switched between the first and second excitation pulse and—as described above—affects only the first spin system of the first slice. Furthermore, an additional correction magnetic field gradient can be implemented after the first and second excitation pulses, but before the refocusing pulses. Such a correction magnetic field gradient affects both the first spin system and the second spin system. It is also possible to implement the additional correction magnetic field gradient after the refocusing pulses but before the detection step to detect the signal, for example. This can produce a high flexibility in the introduction of a correction phase since in particular a correction phase that is different than the phase introduced at the second spin system can be introduced to the first slice via the first correction magnetic field gradient.

It can be particularly advantageous for the second difference time period to be twice as long as the first difference time period. If the time duration between the respective temporal centers of the second excitation pulse and of the first excitation pulse is twice as long as the time duration between the temporal centers of the second refocusing pulse and the first refocusing pulse, this has the effect that the spin echo condition is satisfied simultaneously during the signal detection time period. This is so even though the spin echo times (i.e. the time period between excitation and signal detection) for the first and second slice are of different lengths. By the application of refocusing pulses to generate a spin echo and the simultaneous satisfaction of the spin echo condition of the first and second slice, in the described embodiment a magnetization signal can accordingly be generated that is also similar to a spin echo. In addition to the condition of the rephasing of the coherence curves of the first and second slice, the spin echo condition is also satisfied in the signal detection time period. This can advantageously produce a particularly high signal.

As explained above, it is also possible for the second difference time period to be so short (shorter than the duration of the first excitation pulse) that the first and second excitation pulse at least partially overlap. This produces a shortened measurement time.

Furthermore, the invention can include the steps of applying a first diffusion refocusing pulse to invert the dephasing of the first spin system, and applying a second diffusion refocusing pulse to invert the dephasing of the second spin system, with the beginning of the second diffusion refocusing pulse being temporally shifted by a third difference time period relative to the beginning of the first diffusion refocusing pulse. Measurement sequences for MR imaging to depict diffusion properties of particles are typically implemented using an additional refocusing pulse (diffusion refocusing pulse). According to the present invention, a rephasing of the first and second coherence curves can also be implemented in measurement sequences for MR diffusion imaging according to slice multiplexing. This has the advantage that the measurement durations that are necessary for diffusion imaging (which measurement durations are longer anyway) can be shortened.

It can be advantageous for the third difference time period and the first difference time period to be of equal length in terms. If the first difference time period that relates to the refocusing pulses and the second difference time period that relates to the diffusion refocusing pulses are of equal length (meaning that the time shift is the same), a simple calculation of the rephasing correction step is thus possible, so the required correction phase can be calculated in a simple manner.

The direction of the time shift by the first difference time period for the first and second refocusing pulses can be the same as the direction of the time shift by the third difference time period of first and second diffusion refocusing pulse. For example, the rephasing correction step then does not depend on the first or third difference time periods. This can be advantageous since an inherently robust method and a simple calculation of the correction phase are thus possible.

According to the invention it is also possible for the direction of the time shift by the first difference time period for first and second refocusing pulses to be opposite the direction of the time shift by the third difference time period of first and second difference refocusing pulses.

Furthermore, the first radio-frequency pulse can be a first excitation pulse to excite the first spin system out of the idle state, and the second radio-frequency pulse can be a second excitation pulse to excite the second spin system out of the idle state. A partial temporal separation of the radio-frequency excitation pulses according to the aspect of the present invention has the advantage that the measurement time duration of the slice multiplexing measurement sequence is shortened, and that the necessary peak RF power of the excitation pulses is simultaneously reduced.

The coherence curve of the spin system is dephased by the application of the radio-frequency pulse. This dephasing must be rephased before acquisition of the echo via suitable switching of magnetic field gradients. In the event that a first difference time period produces the partial temporal separation of the radio-frequency excitation pulses, a different linear phase profile or a different coherence curve, is impressed on each slice. This occurs because the partial time shift of the excitation of the various slices causes the magnetic field gradient to be active for different lengths of time for different slices.

It is then possible only with difficulty to rephase the coherence curves with a single, spatially linear magnetic field gradient or, respectively, to rephase the dephasing of both coherence curves simultaneously. In contrast to this, the use of refocusing radio-frequency excitation pulses allows a simultaneous rephasing: the first and second excitation pulse can intrinsically impress a correction phase.

Furthermore, it is possible for the rephasing correction step to embody a design of the first or second radio-frequency pulse in order to cause the correction phase to be impressed during the application of the excitation pulses.

The rephasing correction step can also include the application of a correction magnetic field gradient, as described above. For example, it is possible to use amplitude-modulated radio-frequency pulses with predetermined correction phases in combination with correction magnetic field gradients. This allows a high degree of flexibility in the introduction of the correction phase, and can compensate for technical limitations in the embodiment of the radio-frequency pulses impressing the radio-frequency phase.

This rephasing correction step can include a correction magnetic field gradient that has a nonlinear spatial dependency. As is described above, by a nonlinear spatial dependency, a different phase curve is impressed in different slices at the same point in time, so it is possible to rephase the coherence curves.

According to a further aspect of the present invention, a magnetic resonance system is provided that is designed to rephase a first spin system in a first slice with a first coherence curve and a second spin system of a second slice with a second coherence curve given generation of MR images with slice multiplexing. The magnetic resonance system has a radio-frequency generator of an MR data acquisition unit that is designed to apply a first radio-frequency pulse to deflect the spin system of the first slice, and to apply a second radio-frequency pulse to deflect the spin system of the second slice; with the beginning of the second radio-frequency pulse being shifted in time relative to the beginning of the first radio-frequency pulse by a first difference time period that is shorter than the duration of the first radio-frequency pulse. Furthermore, according to this aspect of the invention the magnetic resonance system has a pulse sequence controller that is designed to operate the MR data acquisition unit to implement a first rephasing correction step that impresses a correction phase on at least one of the two spin systems. Furthermore, the magnetic resonance system has a computer that is designed to implement a detection step by detecting first and second signals of the magnetization of the first and second spin system respectively in a signal detection time period. The rephasing correction step is executed so that the first and second coherence curve are rephased so that the detection of the first and second signals occurs simultaneously in the signal detection time period.

A magnetic resonance system that is configured in such a manner achieves the advantages that have been described above in connection with the method.

DESCRIPTION OF THE PREFERRED EMBODIMENTS

Figure 1:
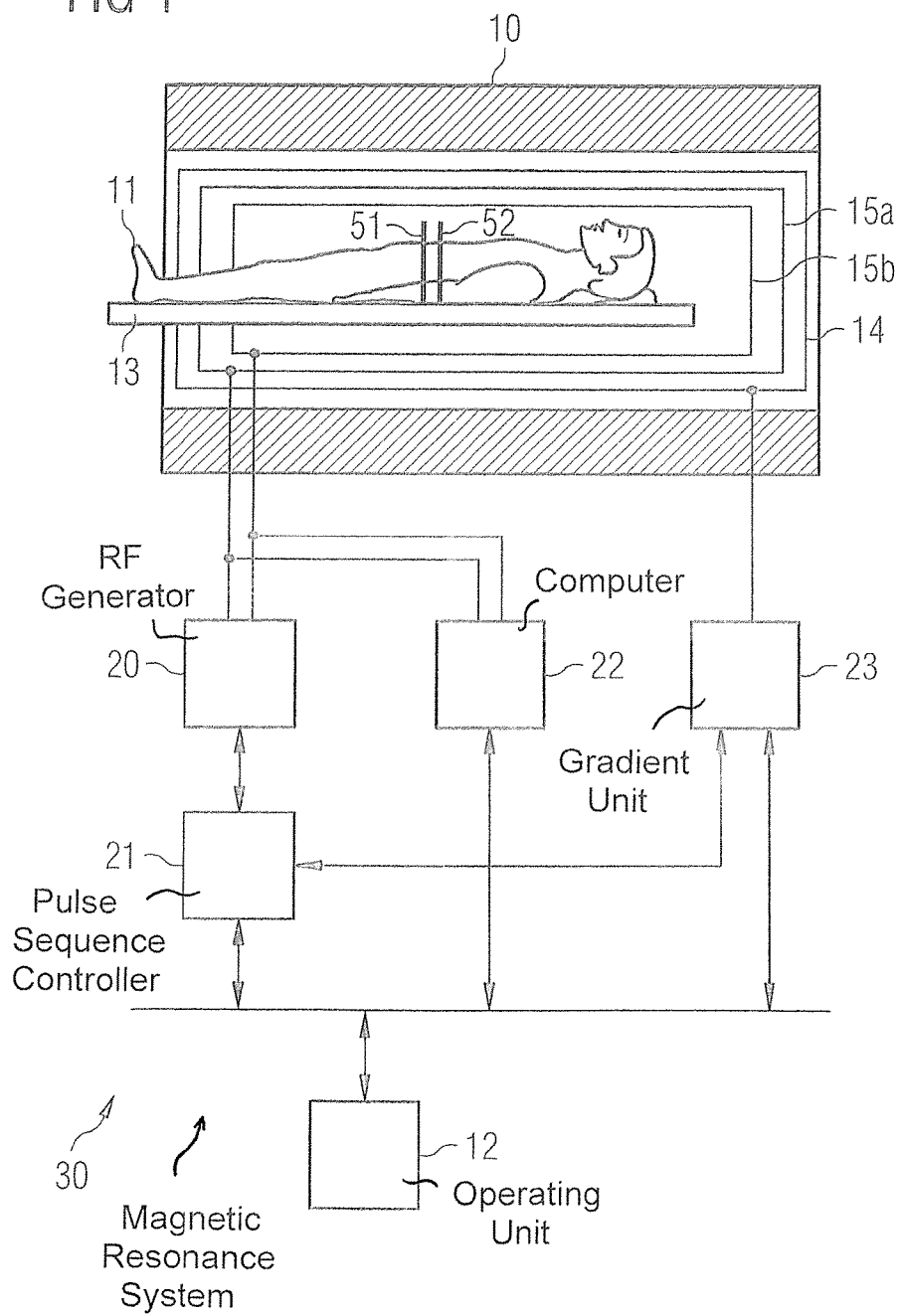
FIG. 1 is a schematic illustration of a magnetic resonance system according to the present invention.

FIG. 1 schematically shows a magnetic resonance system 30 which is configured to acquire magnetic resonance (MR) data. The MR system includes multiple radio-frequency coils 15, 15b, but it is also possible for the MR system 30 to have only one radio-frequency coil. The MR system 30 furthermore has a magnet 10 that is suitable to generate a basic magnetic field. An examination subject—in the presented case an examined patient 11—can be slid into the magnet 10 by a movable bed 13. To generate MR image data from a first slice 51 and second slice 52 that are arranged within the examined patient 11, the MR system 30 furthermore has a gradient system 14 configured to provide magnetic field gradients in the region of the examined patient 11. Magnetic field gradients produce a spatial coding of the effect of radio-frequency pulses on the resonance condition of the spin systems. The basic magnetic field generated by the magnet 10 polarizes the spin system in the first slice 51 and the second slice 52. In their idle state, the spins point along the direction of the basic magnetic field. With the radio-frequency coils 15*a* and 15*b*, a radio-frequency pulse can be generated that deflects the magnetization out of its idle state in the basic magnetic field. A radio-frequency generator 20 is provided to apply radio-frequency pulses by means of the radio-frequency coils 15*a*, 15*b*. Furthermore, a magnetization signal that inductively produces a voltage in the radio-frequency coils 15*a*, 15*b* be detected and supplied to a computer 22. A gradient unit 23 is provided in order to control the gradient system 14 to apply magnetic field gradients. A pulse sequence controller 21 controls the chronological workflow of the radio-frequency pulses that are generated via radio-frequency generator 20 and the magnetic field gradients that are controlled via gradient unit 23. An operating unit 12 is connected with the control elements and allows a user to implement the control of the magnetic resonance system 30. In particular, computer 22 can control the radio-frequency coils 15*a*, 15*b* such that sufficient MR data are acquired in order to generate a complete data set by means of a suitable algorithm. Methods of parallel imaging (for example SMASH, GRAPPA or SENSE) are known to those skilled in the art for this purpose. Furthermore, the gradient unit 23 can control the gradient system 14 such that nonlinear magnetic field gradients are generated.

The radio-frequency generator 20 can furthermore configure the radio-frequency pulses (that are applied via radio-frequency coils 15*a*, 15*b*) so that they furthermore define a spatial phase response in addition to a spatial amplitude dependency. For example, this can be achieved by means of suitable amplitude or phase modulation of the RF pulses. Furthermore, the radio-frequency generator 20 can configure the radio-frequency pulses that are applied by means of the radio-frequency coils 15*a*, 15*b* such that they have a time curve of the amplitude that is asymmetrical relative to the point in time of the maximum amplitude of the respective excitation pulse.

The general operation of an MR system is known to those skilled in the art, such that a more detailed description of the basic components need not be provided herein.

Figure 2:
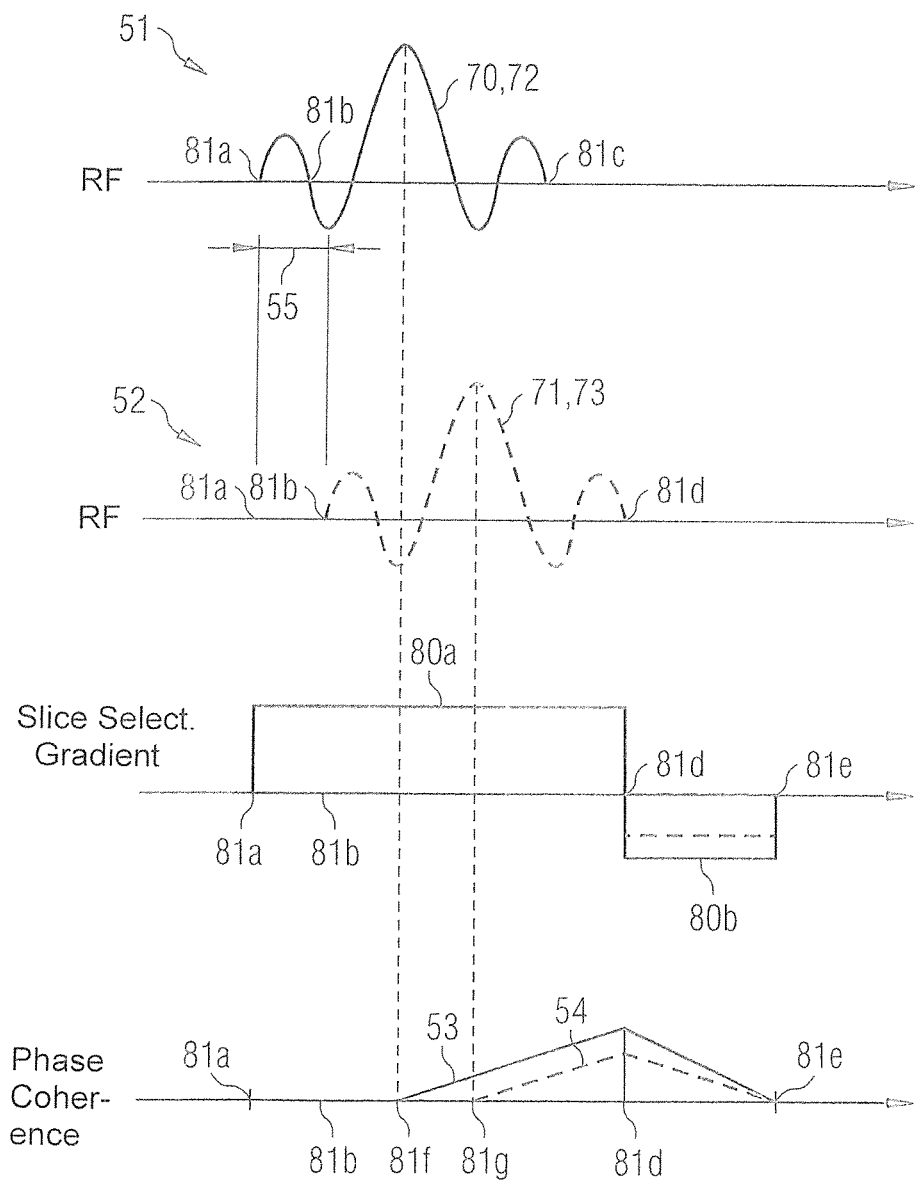
FIG. 2 is a schematic illustration of partially overlapping radio-frequency pulses and a rephasing of the coherence curve using a nonlinear magnetic field gradient.

FIG. 2 shows as an example an embodiment of a method according to the present invention. Radio-frequency pulses—for example excitation pulses 70, 71 or refocusing pulses 72, 73—are respectively located on a first slice 51 and a second slice 52 that are located in the spatial region of the examined patient 11. A first radio-frequency pulse 70, 72 is applied specifically to the first slice 51 (i.e. slice-selectively). A second radio-frequency pulse 71, 73 is slice-selectively applied to the second slice 52. The second radio-frequency pulse 71, 73 is hereby depicted with a dashed line. The time curve is shown in FIG. 2 as a horizontal axis. The radio-frequency pulses 70, 71, 72, 73 are schematically illustrated using the amplitude envelopes according to a sinc pulse. It is known to those skilled in the art that a sinc amplitude-modulated excitation pulse produces particularly advantageous spatial excitation profiles.

The time curve of the first radio-frequency pulse 70, 72 is characterized by an initial point in time 81*a* and a final point in time 81*c*. The maximum of the amplitude is achieved at the point in time 81*f*. The time curve of the second radio-frequency pulse 71, 73 is accordingly characterized by an initial point in time 81*b* and a final point in time 81*d*. The maximum of the amplitude is achieved at the point in time 81*g*. As is to be learned from FIG. 2, a magnetic field gradient 80*a* acts with interruption between the point in time 81*a* (beginning of the first radio-frequency pulse 70, 72) and the point in time 81*d* (end of the second radio-frequency pulse 71, 73). The point in time 81*b* of the beginning of the second radio-frequency pulse 71, 72 is time-delayed relative to the point in time 81*a* of the beginning of the first radio-frequency pulse 70, 72. This corresponds to the first difference time period 55 (time period between point in time 81*a* and point in time 81*b*).

The lowermost part of FIG. 2 shows a first coherence curve 53 that is associated with the phase of the first spin system of the first slice 51 and a second coherence curve 54 that is associated with the phase of the second spin system of the second slice 52. The second coherence curve 54 is depicted with a dashed line. As can be seen in FIG. 2, an increase of the dephasing (linear phase transition) of the first spin system is produced during the time period 81*f*-81*d*.

If the second radio-frequency pulse 71, 73 is an excitation pulse (meaning that the pulse produces a deflection of the magnetization out of an idle state defined by the basic magnetic field), this cause the magnetic field gradient 80*a* to have no effect on the second coherence curve 54 before the point in time 81*g*. This is the case since the magnetization in the second slice 52 persists in its idle state before the point in time 81*g*, and a magnetic field gradient 80*a* cannot deploy an effect on the second coherence curve 54. However, it is also possible for radio-frequency pulse 71, 73 to be a refocusing pulse. In FIG. 2 there would then be a variation of the second coherence curve in the time period 81*a*-81*b*.

According to FIG. 2, the incipient dephasing of the second coherence curve 54 is shifted by the first difference time period 55 (time period between 81*a* and 81*b*, or between 81*f* and 81*g*) relative to the beginning of dephasing of the first coherence curve 53. This has the effect that the first and second coherence curve 53, 54 have a different degree of dephasing at the point in time 81*d*, i.e. after the end of the application of the magnetic field gradient 80*a*. This is graphically indicated in that the coherence curves 53, 54 are not congruent at the point in time 81*d*.

Such a different degree of dephasing will always generally occur when conventional radio-frequency pulses (i.e. sinc amplitude-modulated RF pulses) are partially temporally overlapping. As is described in the following (for example in relation to FIG. 11), but it is also possible for the RF pulses not to be sinc amplitude-modulated. For example, it is possible for the RF pulses to have an asymmetrical time curve.

It is the object of the present invention to produce a rephasing of the first and second coherence curve via impression of a correction phase. According to the embodiment that is shown in FIG. 2, this can occur by the application of a nonlinear magnetic field gradient 80*b*: the magnetic field gradient has a spatial curve of the magnetic field strength that is nonlinear along the selection direction. For example, the nonlinear curve can be described by a quadratic function. This has the effect that the magnetic field gradient introduces different correction phases at the different slices. This is schematically illustrated in FIG. 2. A rephasing of the first and second coherence curves 53, 54 at the point in time 81*e* is produced via the introduction of different correction phases during the time period 81*d*-81*a*. Since the first and second coherence curves 53, 54 both have disappearing dephasing at the point in time 81e, the further MR measurement sequence can take place according to conventional methods.

Figure 3:
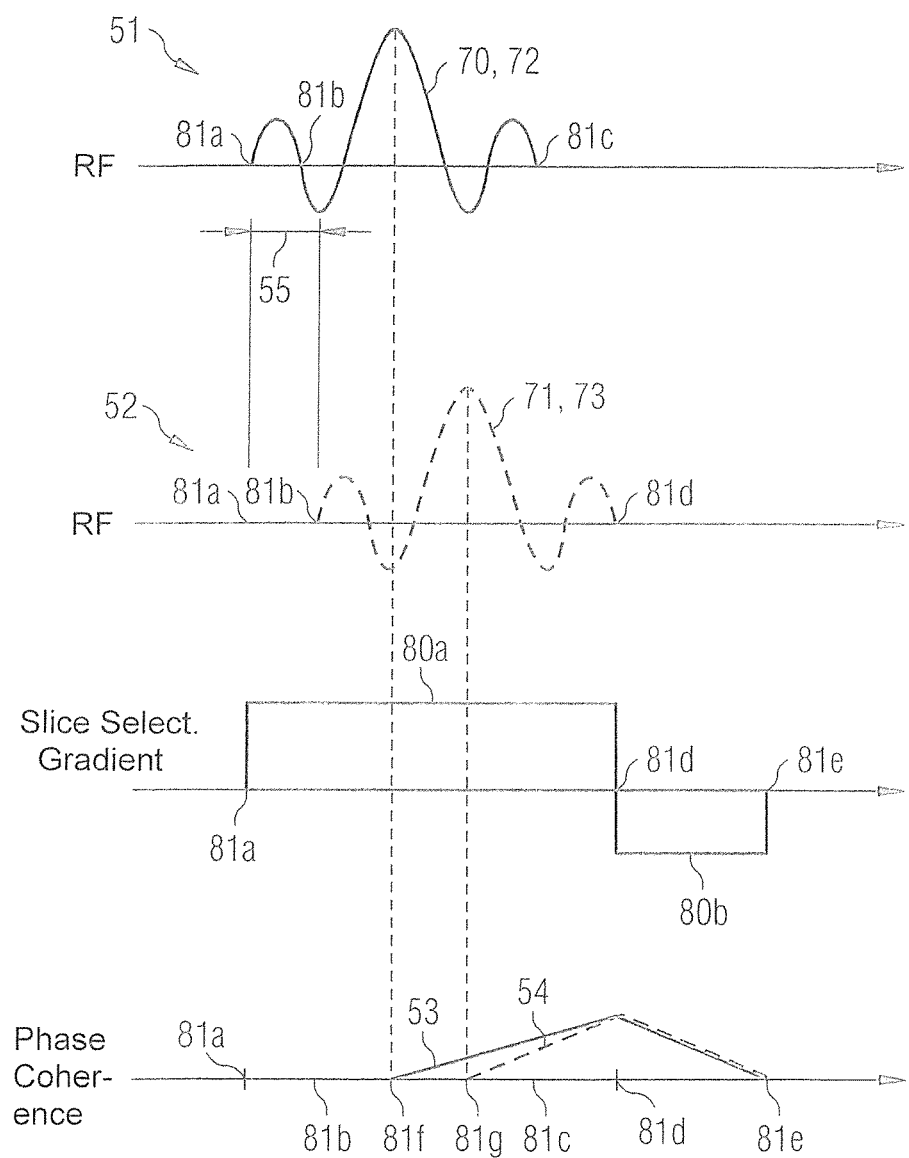
FIG. 3 is a schematic illustration of partially overlapping radio-frequency pulses with an intrinsically predetermined phase profile.

A further embodiment of the present invention is schematically illustrated in FIG. 3. Corresponding to FIG. 2, first RF pulses 70, 72 act on the spin system of a first slice 51 and a second radio-frequency pulses 71, 73 act on the spin system of the second slice 52. The second RF pulses 71, 73 are represented with dashed lines in FIG. 3. While the first RF pulses 70, 72 act in a time period between the points in time 81a and 81c, the second RF pulses 71, 73 act in a time period between the points in time 81b and 81d. The point in time 81b at the beginning of the second RF pulses 71, 73 is therefore shifted by a first difference time period relative to the point in time 81a of the beginning of the first RF pulses 70, 72. The first difference time period is defined by the points in time 81a and 81b. A magnetic field gradient 80a acts with interruption between the time periods 81a and 81d. The magnetic field gradient 80a produces a spatial coding of the excitation of the spin system respectively with regard to first slice 51 and second slice 52.

In the presently discussed case, the RF pulses 70-73 are designed such that a specific phase curve is impressed during the application of the RF pulses (which is a different than in FIG. 2). This is apparent from FIG. 3 because the rate of the dephasing as a function of time for the first coherence curve 53 is different from the rate of the dephasing of the second coherence curve 54 (which is different than in FIG. 2). By suitable selection of the RF pulses 70-73, the rate of the dephasing of the coherence curves 53, 54 can be adapted such that the coherence curves 53, 54 have an identical dephasing after the end of the second RF pulse, i.e. at the point in time 81d after the slice selection gradient 80a is deactivated. This is enabled via the targeted introduction of the correction phase via suitable design of the RF pulses. By suitable amplitude and phase modulation of the exciting RF pulse the coherence curve of the correspondingly excited slice is caused to have a dephasing rate during the application of the RF pulse, this dephasing rate being suitable to compensate for the offset of the first and second coherence curve that is produced by the final difference time period.

Such RF pulses can have an amplitude modulation that is not sinc amplitude-modulated. Therefore, the sinc-like amplitude modulation that is depicted in FIG. 3 is to be understood purely as an example. Other, complex forms of the amplitude modulation are possible or necessary. An asymmetrical time curve of the amplitude modulation is also possible and described in the following with regard to FIG. 11.

Figure 4:
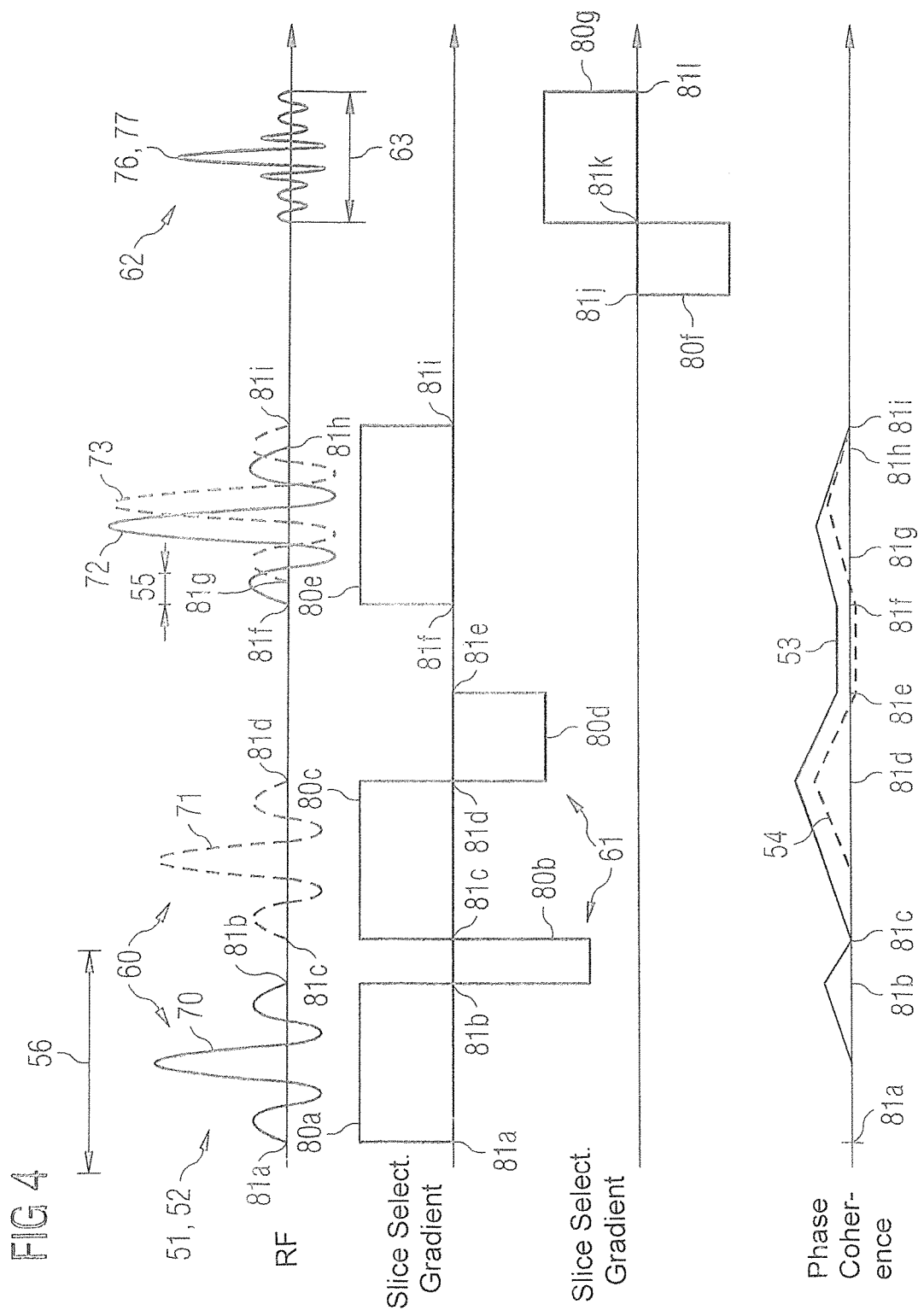
FIG. 4 is a schematic illustration of an embodiment of the present invention for rephasing a first and second coherence curve given a partial time separation of the refocusing pulses.

FIG. 4 shows a further embodiment of a method according to the present invention for rephasing of a first and second coherence curves 53, 54 of a first and second spin system of the respective first and second slices 51, 52. The spin system of a first slice 51 is hereby excited by a first excitation pulse 70. The excitation of the first spin system takes place in the time period that is bounded by the points in time 81a and 81b. The excitation of the spin system of the second slice 52 takes place via a radio-frequency pulse, i.e. an excitation pulse 71. This second excitation pulse 71 is applied during the time period that is bounded by the points in time 81c and 81d. Magnetic field gradients 80a and 80c respectively act during the first excitation pulse 70 and the second excitation pulse 71. The excitation step 60 includes the RF pulses 70, 71 and the corresponding magnetic field gradients 80a, 80c.

The first excitation pulse 70 and the second excitation pulse 71 also do not overlap. A second difference time period 56 which is defined by the time difference between the points in time 81a and 81c is longer than the duration of the first excitation pulse 70 (time duration 81a-81b). In particular, in the shown measurement sequence the possibility exists to switch a magnetic field gradient 80b between the two excitation pulses 70, 71.

An additional gradient field 80d is switched following the second excitation pulse 71. Both a refocusing pulse 72 acting on the first slice 51 and a refocusing pulse 73 acting on the second slice 52 are applied during an additional gradient field 80e. The refocusing pulses produce a refocusing of the coherence curves 53, 54 of the first and second slice 51, 52. This can be schematically represented by an inversion of the algebraic sign of the phase introduced to the coherence curve 53, 54 by a defined gradient field 80. This schematic representation of the effect of refocusing pulses on the coherence curves is used in FIG. 4-6.

As can be seen from FIG. 4, the first and second coherence curves 53, 54 are rephased at the point in time 81i (i.e. immediately after the end of the refocusing pulses or, respectively, immediately before the signal detection time period 63) and in particular have a disappearing dephasing. This is explained in detail in the following.

A change of the phase $M_a-M_e$ is respectively linked with the magnetic field gradients 80a-80e. For instance, $M_a$ thus designates the dephasing of the coherence curve that builds up during the application of the magnetic field gradient 80a. Formulated in a different way, the variables designated by $M_a-M_e$ are not phases but rather gradient moments, i.e. the time integral of the gradient amplitude. A dephasing of the signals within a defined volume—i.e. within a slice—then accompanies such gradient moments. $M_a/2-M_b+M_c-M_d-M_x=0$ must be valid for the first slice. $M_x$ is the phase that is exerted by the magnetic field gradient 80e on the first slice in the time period that is defined by the points in time 81h and 81i. Since this time period is located after the application of the first refocusing pulse 72, in spite of the positive magnetic field gradient 80e the phase is provided with a negative algebraic sign, as explained above. The condition that the sum of all phases must be equal to 0 is equivalent with a disappearing dephasing of the first coherence curve 53 at the point in time 81i and is a requirement for the detection of an MR signal.

$M_c/2-M_d+M_x=0$ must accordingly apply for the second slice. $M_x$ is provided with a positive algebraic sign in relation to the second coherence curve 54 since the magnetic field gradient 80e acts on the magnetization of the second slice 52 before the application of the refocusing pulse 73 in the time period that is defined by the points in time 81f and 81g.

From these conditions, which guarantee a rephasing of the first and second coherence curve 53, 54 with disappearing dephasing at the point in time 81i, respective conditions can be derived for the correction phases $M_b$ and $M_d$ (and therefore for the magnetic field gradients 80b and 80d): these conditions read $M_b=M_a-2M_x$ and $M_d=M_c/2+M_x$ insofar as (for example) $M_a=M_c$ is assumed. Since $M_x$ is directly proportional to the first difference time period (wherein the first difference time period is provided by the time period that is bounded by the points in time 81f and 81g), given a predetermined difference time period a condition can be derived for the selection of the magnetic field gradients 80b and 80d. The magnetic field gradients 80b and 80d are therefore associated with a rephasing correction step 61 to impress a correction phase that is proportional to the magnetic field gradients 80b and 80d. The correction phase that is impressed by the magnetic field gradients 80b and 80d can be defined both via the duration of the magnetic field gradients 80b, 80d and via their strength.

The progression of the first and second coherence curve 53, 54 over time is graphically illustrated in the lower part of FIG. 4. The second coherence curve 54 is represented by a dashed line. In that the magnetic field gradient 80e acts on the first slice after application of the refocusing pulse 72 or, respectively, on the second slice before application of the second refocusing pulse 73, the phase changes that are connected with this are afflicted [sic] with different algebraic signs. This is graphically illustrated in that the second coherence curve 54 experiences a positive change in the time period that is defined by the points in time 81f and 81g, while the first coherence curve 53 experiences a negative change in the time period that is defined by the points in time 81h and 81i. This difference in the algebraic sign makes it necessary to impress a corresponding correction phase on the coherence curves 53, 54 during the rephasing correction step that—in the presently discussed embodiment—is associated with the magnetic field gradients 80b and 80d.

Since the first and second signal 76, 77 can be acquired simultaneously from the first and second slice 51, 52 during the signal detection time period 63 (which is bounded by the points in time 81k and 81l) in the detection step 62, methods of MR imaging according to slice multiplexing measurement sequences can be applied.

Figure 5:
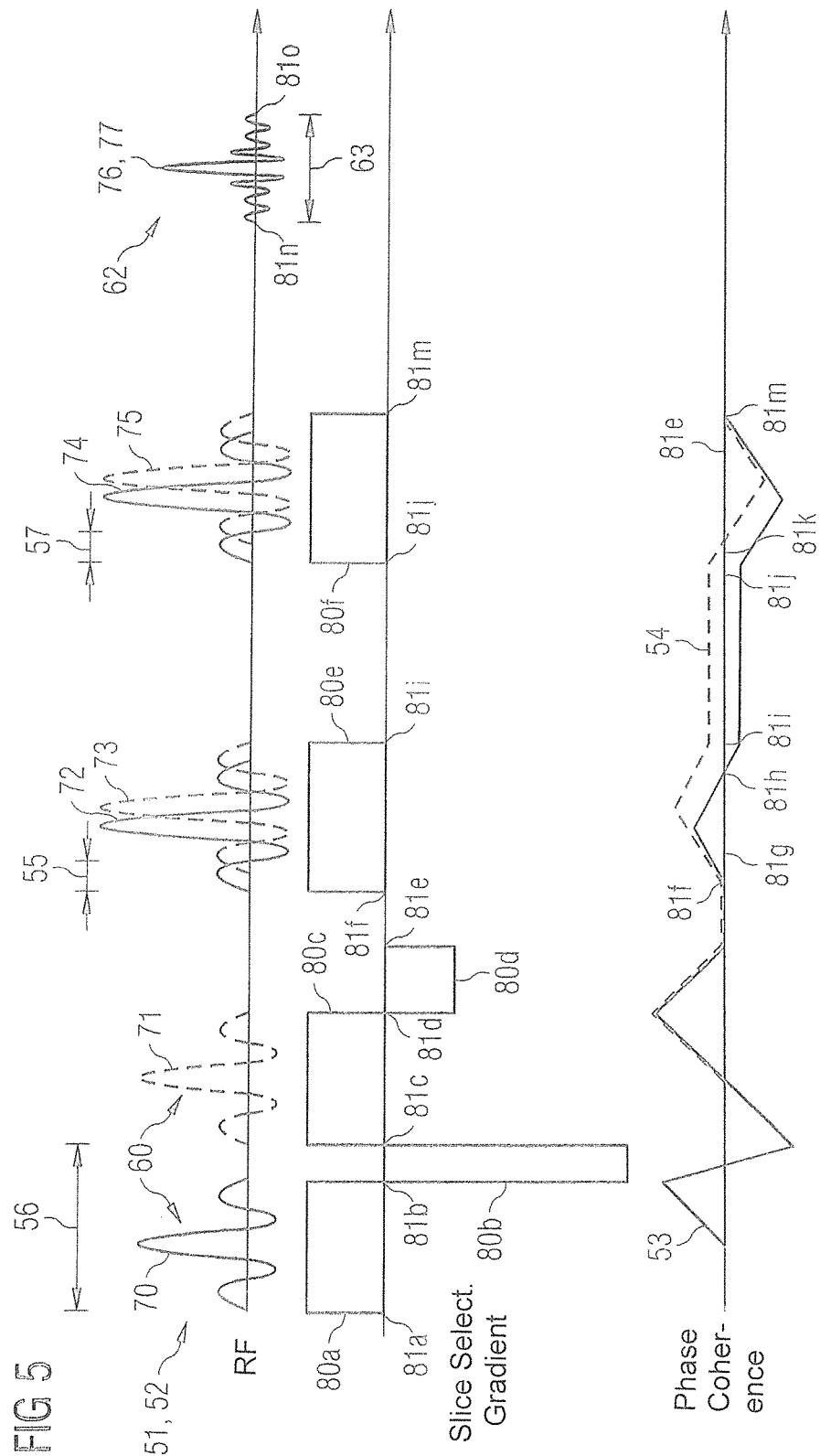
FIG. 5 is a schematic illustration of an embodiment of the present invention for rephasing of a first and second coherence curve given a partial temporal separation of the refocusing and diffusion refocusing pulses.

A further embodiment of the present invention is illustrated in FIG. 5. In particular, an MR measurement sequence is presented in which a first pair of refocusing pulses 72, 73 and a second pair of diffusion refocusing pulses 74, 75 enable an MR imaging according to a diffusion method. The detection of the first signal 76 from the first slice 51 and the detection of the second signal 77 from the second slice 52 take place simultaneously in a detection step 62 during a signal detection time period 63 that is bounded by the points in time 81n and 81o. As has already been explained in detail, slice multiplexing measurement sequences can accordingly be applied. According to the presently discussed embodiment, both the first and second refocusing pulses 72, 73 and the first and second diffusion refocusing pulses 74, 75 are time-shifted counter to one another. The second refocusing pulse 73 is hereby time-delayed by a first difference time period 55 relative to the first refocusing pulse 72. The first difference time period 55 is bounded by the points in time 81f and 81g. The second diffusion refocusing pulse 74 is also time-shifted relative to the first diffusion refocusing pulse 74. The time shift of the diffusion refocusing pulses by a third difference time period 57 takes place in the same time direction as the shift of the refocusing pulses. The third difference time period 57 is defined by the duration that is bounded by the points in time 81j and 81k.

According to the present invention, correction magnetic field gradients 80b and 80d are dimensioned such that the first coherence curve 53 of the first slice 51 and the second coherence curve 54 of the second slice 52 are rephased (and in particular have a disappearing dephasing) at the point in time 81m, i.e. after the end of the magnetic field gradients 80f that is applied during the diffusion refocusing pulses 74, 75. The disappearing dephasing is the requirement in order to measure a signals 76, 77 of the first and second slices 51, 52 during the signal detection time period 63.

It is now explained how the correction magnetic field gradients 80b and 80d must be dimensioned so that the condition that was just cited is satisfied. As discussed with regard to FIG. 4, the magnetic field gradients 80a-80f are associated with phases $M_a$–$M_f$. As was already explained with regard to FIG. 4, the phases $M_a$–$M_f$ are dephasings of the spin system introduced by the action of the magnetic field gradients. For the first slice 51 it must be valid that the sum of all impressed phases is equal to 0 (i.e. $M_a/2-M_b+M_c-M_d-M_x+M_x=0$) at the point in time 81m. Accordingly, it must be ensured that the sum of all phases impressed by magnetic field gradients 80c-80f is also equal to 0 for the second slice 52. In particular, it must be valid that: $M_c/2-M_d+M_x-M_x=0$. As an example, it is assumed that the dephasing that takes place in the difference time periods 55 and 57 is identical.

As described above, from the conditions for disappearing dephasing for the first and second slice 51, 52 at the point in time 81m it is clear that the phase shift $M_x$ produced by the first and third difference time periods is canceled out of the summation and is accordingly not significant for the criterion of disappearing dephasing at the point in time 81m. In other words: when both the refocusing pulse and the diffusion refocusing pulse are shifted by the same time period 55, 57 and in the same time direction, an intervening dephasing of the first and second coherence curves 53, 54 is automatically compensated at the point in time after the end of the diffusion refocusing pulses. A separate influencing by means of a rephasing correction step is not necessary or, respectively, the correction phase can be equal to zero. The correction phase does not depend on the first difference time period 55. In the event that the time periods 55 and 57 are not selected to be identical, a complete rephasing of the signals of both slices can still be achieved via suitable selection of the correction phases 80b and 80d.

Figure 6:
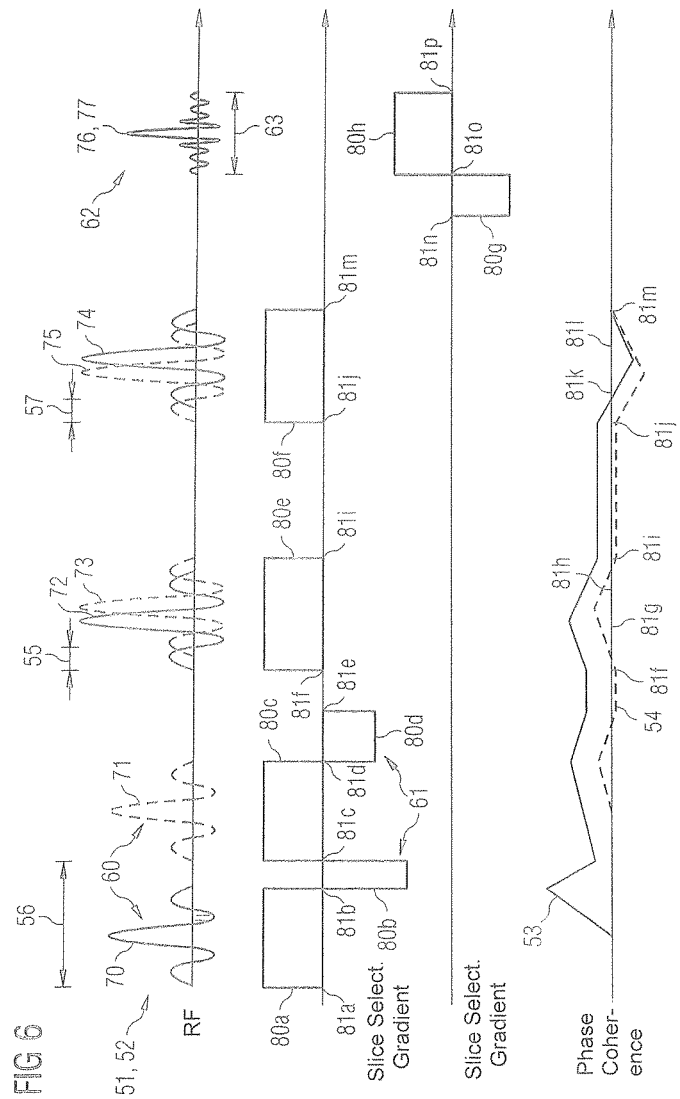
FIG. 6 is a schematic illustration of an embodiment of the present invention for rephasing of a first and second coherence curve given a partial temporal separation of the refocusing and diffusion refocusing pulses.

An embodiment of the present invention is also shown in FIG. 6, in which both a first refocusing pulse 72 and a second refocusing pulse 73 and a first and second diffusion refocusing pulse 74, 75 are applied to the first and second spin system. In contrast to FIG. 5 discussed above, however, in FIG. 6 the direction of the time shift of the first and second refocusing pulses 72, 73 is opposite the direction of the time shift of the first and second diffusion refocusing pulses 74, 75.

The beginning of the second refocusing pulse 73 is time-shifted by a first difference time period relative to the beginning of the first refocusing pulse 72. The first difference time period 55 is bounded by the points in time 81f and 81g. In contrast, the second diffusion refocusing pulse 75 begins before the first diffusion refocusing pulse 74. The beginning of the second diffusion refocusing pulse 75 is delayed by a third difference time period 57 relative to the beginning of the first diffusion refocusing pulse 74. The third difference time period is bounded by the points in time 81j and 81k. In the embodiment of the present invention that is shown in FIG. 6, the first and the third difference time periods are identical in terms of length, meaning that the interval between the points in time 81f and 81g is identical to the interval between the points in time 81j and 81k.

As above, according to the present invention it is necessary for the detection of the first signal 76 and the detection of the second signal 77 occur simultaneously during a signal detection time period 63. The signal detection time period 63 is bounded by the points in time 81o and 81p. In order to ensure a simultaneous detection of the first and second signal 76, 77 during the signal detection time period 63, at the point in time 81m the first and second coherence curve 53, 54 must be rephased and in particular must have a disappearing dephasing. As is apparent from FIG. 6, this is possible given a suitable selection of rephasing correction steps in the form of correction gradient fields 80b and 80d.

In the following it should be explained in detail how the dimensioning of the correction gradient fields 80b and 80d must take place so that the aforementioned criterion for simultaneous detection of the first and second signal 76, 77 is satisfied. For slice 1, phase changes $M_a$–$M_f$ of the coherence curves 53, 54 are associated with the gradient fields 80a-80f. For the first spin system of the first slice 51, the condition of disappearing dephasing at the point in time 81m then reads $M_a/2 - M_b + M_c - M_d - M_x - M_x = 0$. It should be noted that the phase change $M_x$ that is produced by the first and third difference time periods 55, 57 has a negative algebraic sign in the above equation, and therefore does not disappear in the simulation of the acting phase changes. The same applies for the second slice 52 and, $M_c/2 - M_d + M_x + M_x = 0$. Conditions for the dimensioning of the magnetic field gradients 80b and 80d can be established from these conditions for disappearing dephasing for the magnetization of the first and second slice 51, 52. The phases $M_b$, $M_d$ that are impressed by the magnetic field gradients 80b and 80d can be formulated depending on $M_x$. $M_b = M_a - 4M_x$ and $M_d = M_c/2 + 2M_x$, for example insofar as $M_a = M_c$ is assumed. This means that the magnetic field gradients 80b and 80d (and their impressed correction phases) that are associated with the rephasing correction step directly depend on the first or, respectively, third difference time period 55, 57.

In the preceding FIGS. 4-6, only one disappearing dephasing of the first and second coherence curves 53, 54 respectively was discussed as a condition for the generation of a signal from the first and second slice. Such a condition corresponds to a gradient-like echo. For example, such conditions are known from gradient echo measurement sequences. However, it can be advantageous if—in addition to the condition for disappearing dephasing of the coherence curves 53, 54—the spin echo condition is furthermore satisfied. Given application of a refocusing pulses 72, 73. The spin echo condition means that the time periods between excitation pulse and refocusing pulse and between refocusing pulse and signal detection are identical. A spin echo then occurs.

Figure 7:
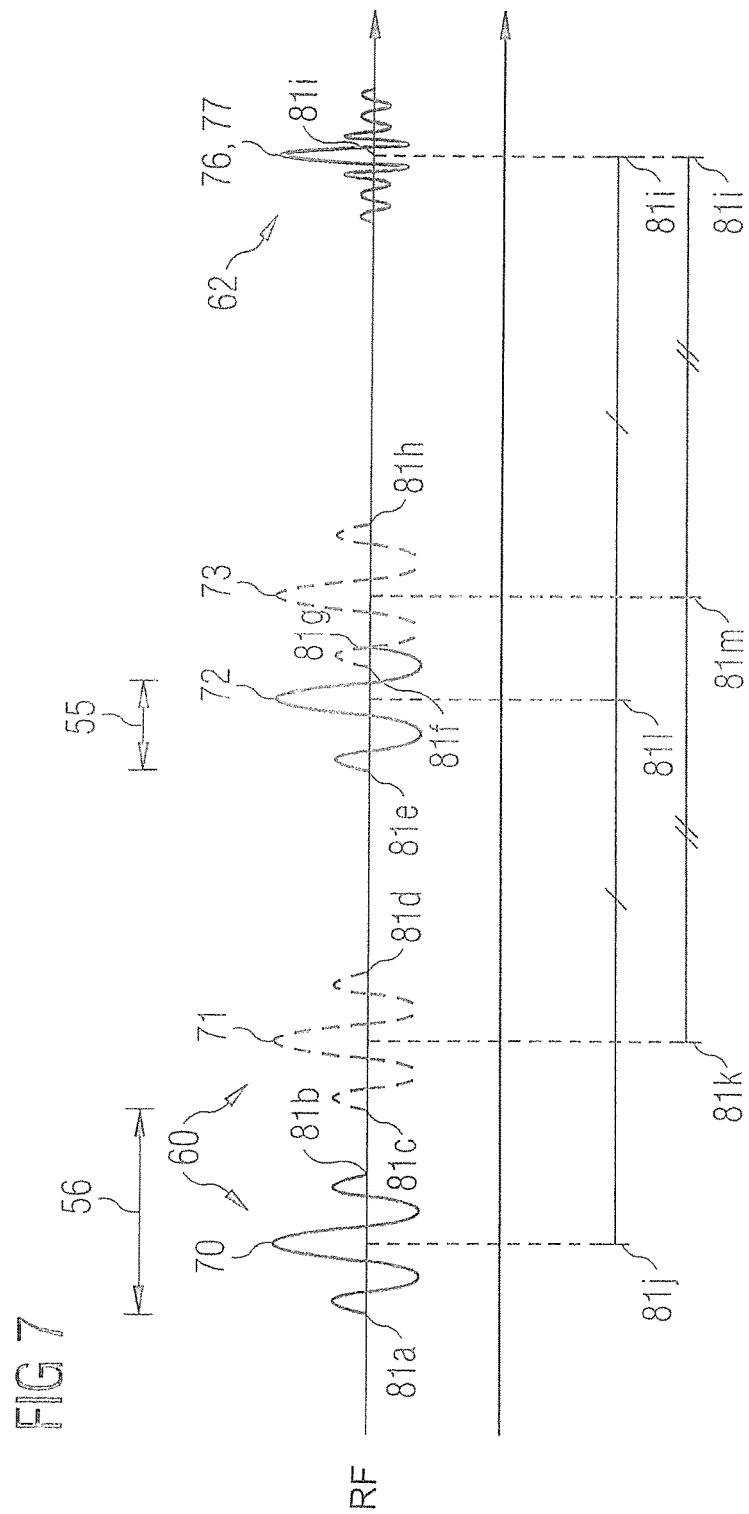
FIG. 7 is a schematic illustration of an embodiment of the present invention given a partial temporal separation of the refocusing pulses, wherein the first difference time period is half as long as the second difference time period.

A further embodiment according to the present invention is shown in FIG. 7, in which the beginning of the second refocusing pulse 73 is delayed by a first difference time period 55 relative to the beginning of the first refocusing pulse 72. The first difference time period 55 is hereby bounded by the points in time 81e and 81f. Furthermore, from FIG. 7 it is clear that the first and second excitation pulse 70, 71 are also shifted by a second difference time period 56. The second excitation pulse 71 is hereby delayed relative to the first excitation pulse 70. The second difference time period 56 is bounded by the points in time 81a and 81c.

In FIG. 7 the duration of the second difference time period 56 is twice as long as the duration of the first difference time period 55. This has the effect that the spin echo condition is satisfied simultaneously at the point in time 81i for the magnetizations of the first and second slice 51, 52. This is the case since the time period that is bounded by the points in time 81j and 81l is identical to the time period that is bounded by the points 81l and 81i. At the same time, the time period that is bounded by the points 81k and 81m is identical to the time period that is bounded by the points in time 81m and 81i. The points in time 81j and 81k hereby also refer to the maximum of the amplitude of the first and second excitation pulse 70, 71. At the same time, the points in time 81l and 81m refer to the maximum amplitude of the refocusing pulses 72, 73. As is in particular clear from FIG. 7, first and second refocusing pulses 72, 73 partially temporally overlap. According to the present invention, this leads to a reduction of the necessary maximum amplitude of the refocusing pulses 72, 73 and at the same time to a minimized measurement time duration, since then signals 76, 77 can be detected simultaneously in a signal detection time period 63 around the point in time 81i.

Figure 8:
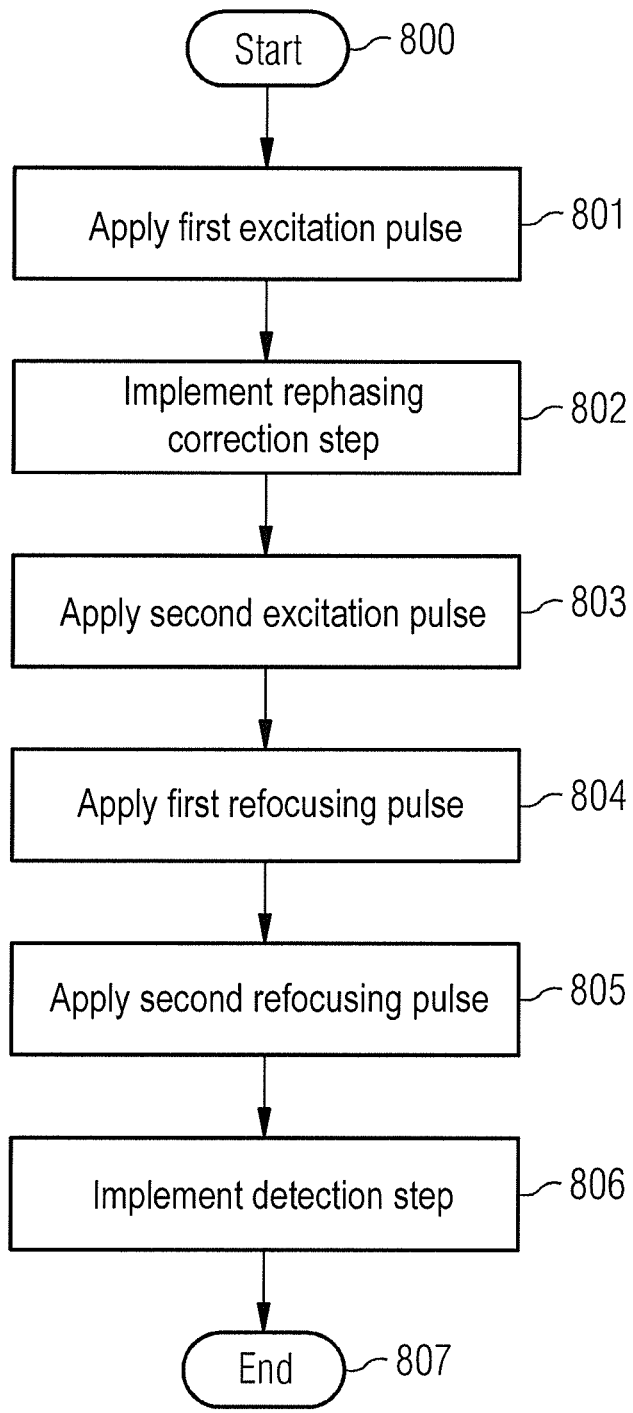
FIG. 8 is a flowchart of an embodiment of the present invention.

A method according to an embodiment of the present invention in the form of a flowchart is shown in FIG. 8. The method begins in Step 800. In Step 801 the magnetization of the first slice is initially deflected out of the idle state via application of a first excitation pulse. Deflection out of the idle state can hereby have the meaning that the magnetization has at least one component along a direction that is perpendicular to the basic magnetic field. After excitation, the transversal component of the magnetization precesses.

According to the present embodiment, a rephasing correction step can be implemented in Step 802. The rephasing correction step can be applied in the form of a correction magnetic field gradient, for example. In particular, via the application of a correction magnetic field gradient in Step 802 it can be brought about that the correction phase that is impressed by the correction magnetic field gradient acts only on the spin system of the first slice. Namely, in Step 802 the spin system of the second slice has not yet been excited and is only deflected out of the idle state by a second excitation pulse in Step 803. A later rephasing of the first and second coherence curve of the spin system of the first and second slice can be produced via clever dimensioning of the correction phase in Step 802.

In Steps 804 and 805, radio-frequency refocusing pulses are applied to the spin system of the respective first and second slice. In particular, the first and second refocusing pulse can partially temporally overlap. According to the present invention, this has the advantage that, via the partial temporal overlapping, a reduction of the necessary maximum amplitude of the refocusing pulses in comparison to the case of complete temporal overlapping can be achieved while the total measurement duration for the implementation of the method presented with FIG. 8 for MR imaging according to slice multiplexing can be reduced.

By suitable selection of the rephasing correction step in Step 802 it is ensured that signals that belong to the first and second slice can be detected simultaneously in a signal detection time period in Step 806. Known methods for slice multiplex imaging can be applied in Step 806. The method ends in Step 807.

Figure 9:
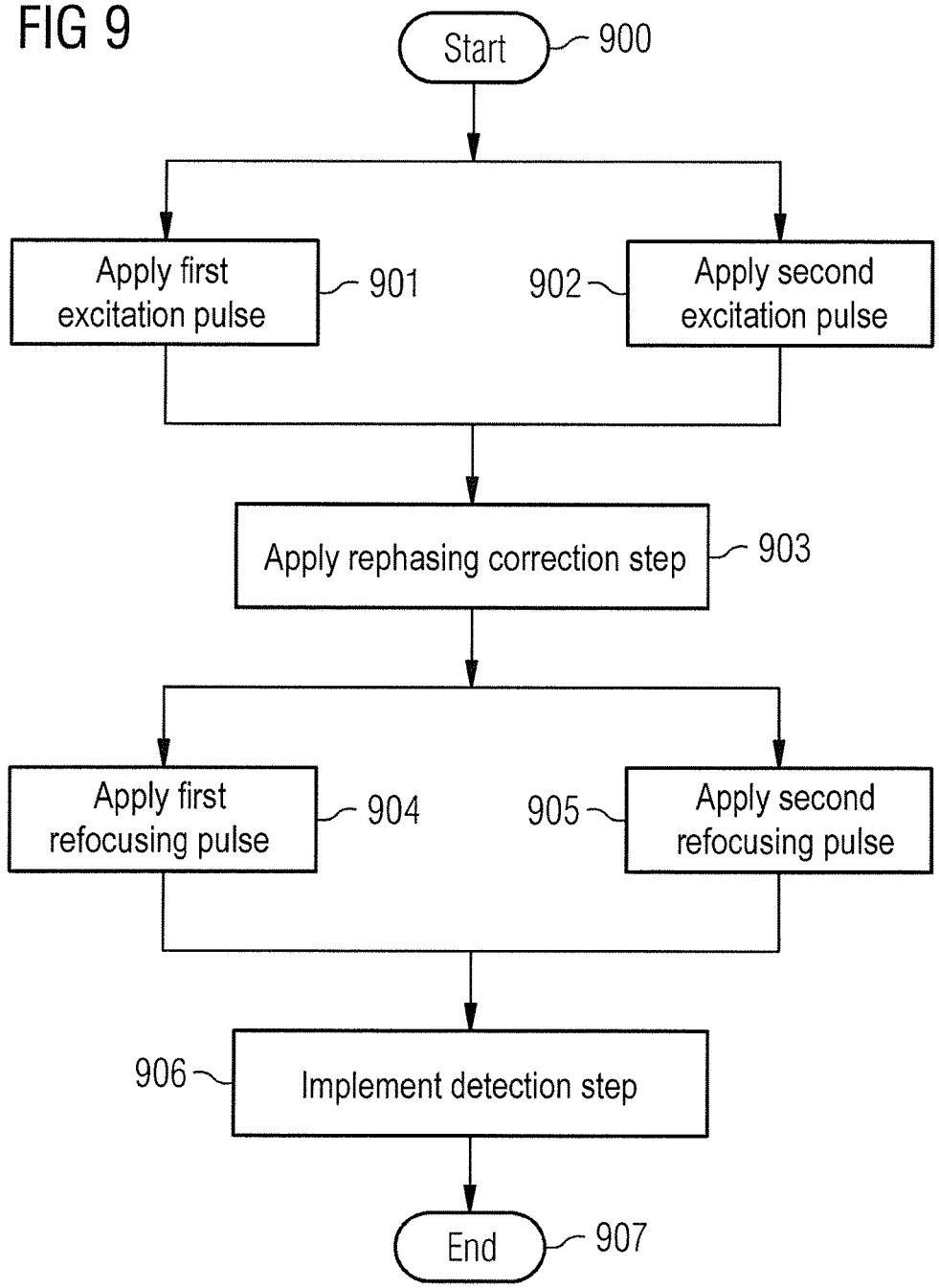
FIG. 9 is a flowchart of a further embodiment of the present invention.

A further embodiment of the present invention is presented in FIG. 9 by means of a schematic flow diagram. The method begins in Step 900. A first and second excitation pulse are applied to the spin system of the first and second slice respectively in Step 901 and 902. In particular, the first and second excitation pulse are applied so that they partially temporally overlap. This means that the beginning of the second excitation pulse is shifted by a first difference time period relative to the beginning of the first excitation pulse, wherein the first difference time period is shorter than the duration of the first excitation pulse.

After the spin systems of the first and second slice have been excited in Step 901 and Step 902, a rephasing correction step can be applied in Step 903. In one embodiment of the present invention the rephasing correction step can be applied simultaneously for both slices. For example, in the presently discussed embodiment this can occur by the application of a nonlinear gradient field. In the slice selection direction a nonlinear gradient field has an amplitude curve that is described by a nonlinear function, for example a second-order polynomial. This results in the correction phases impressed by the nonlinear gradient field being different in the first and second slices.

It is possible for the nonlinear gradient field to be described by a quadratic function. By suitable dimensioning of the linear and quadratic portions, the curve of the magnetic field gradients can be described to a good approximation by a linear function in proximity to the relevant slices. This means that the quadratic curve of the gradient field can be locally well approximated within the first slice by a linear gradient field with a first slope and can be locally approximated within the second slice via a linear gradient field with a second slope. This ensures an easily manageable temporal evolution of the coherence curve over the entire slice thickness. The effective active magnetic field gradient or, respectively, the effective impressed correction phase is then slice-specific. The coherence curves of two or more slices can be simultaneously rephased in this manner.

By the first and second excitation pulses having a partial time shift as described above, the coherence curves of the first and second slice have a different dephasing at the point in time before application of the correction step (i.e. before Step 903). This dephasing can be corrected via suitable selection of the refocusing correction step. The first and second coherence curves are then rephased.

The rephasing within the scope of the rephasing correction step 903 can take place such that provisions are already made for an additional different phase that is impressed on the first and second spin system during Steps 904 and 905. Steps 904 and 905 refer to a first refocusing pulse that acts on the first slice and a second refocusing pulse that acts on the second slice. The first and second refocusing pulses are again time-shifted counter to one another such that they partially temporally overlap. In the present embodiment, this shift is designated by the second difference time period. In particular, the direction of the time shift between the first refocusing pulse and the second refocusing pulse can be opposite the direction of the second shift between the first excitation pulse and the second excitation pulse (Steps 901 and 902).

A different phase is in turn impressed on the first and second coherence curves between the first and second slice via the partial temporal overlap between first and second refocusing pulse. The rephasing correction step 903 can be designed so a complete rephasing of the first and second coherence curves is present at the point in time after application of the refocusing pulses, i.e. after Step 904 or 905 and before the detection step 906.

According to the invention, the detection step 906 is in particular implemented such that a first and second signal from the first and second slice respectively are detected simultaneously in a signal detection time period. For this purpose, it is necessary for the first and second coherence curves to both be rephased and have a disappearing dephasing. The method according to FIG. 9 comes to an end in Step 907.

Figure 10:
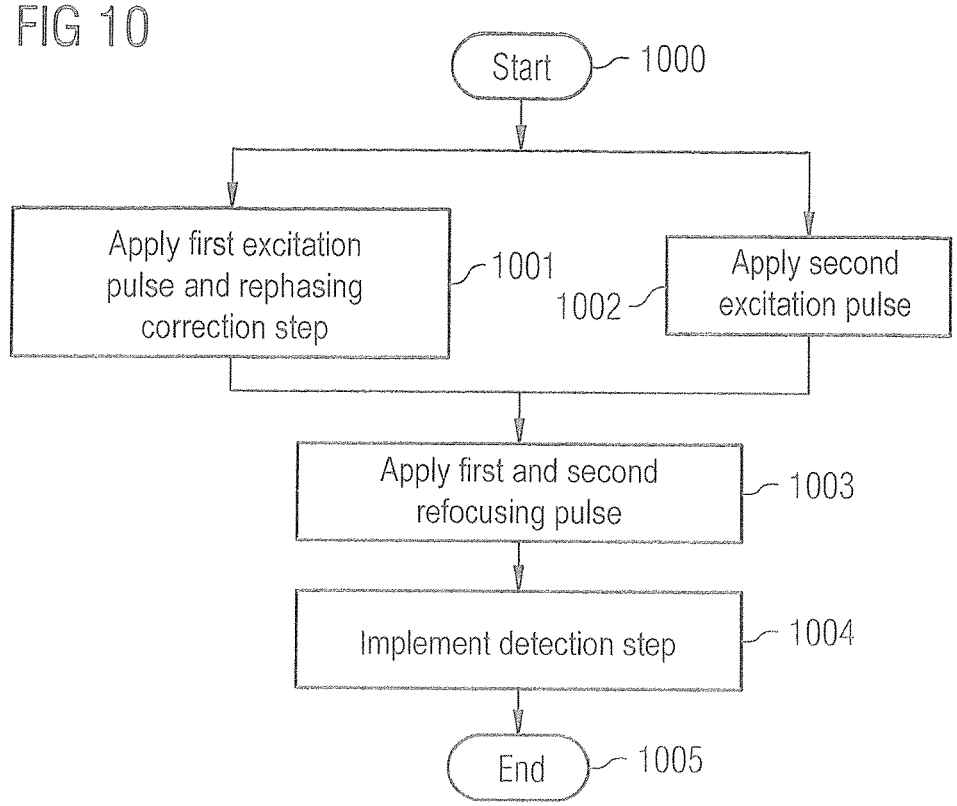
FIG. 10 is a flowchart of another embodiment of the present invention.

An additional embodiment according to the present invention is presented in FIG. 10. The method begins in Step 1000. First and second excitation pulses are applied in Step 1001 and Step 1002. The first excitation pulse acts on the first slice and the second excitation pulse acts on the second slice. The excitation pulses have the effect that the magnetization is deflected out of its idle state (that is provided by the basic magnetic field).

At the same time, the presently discussed embodiment of the present invention is designed such that the application of the first excitation pulse coincides with the application of the rephasing correction step. For example, it is possible to design the first excitation pulse such that a specific correction phase is impressed on the first coherence curve via suitable amplitude or phase modulation of the radio-frequency excitation pulse. This correction phase can be suitable to compensate for a phase difference between the first and second coherence curve that arises due to the partial temporal overlap of the first and second excitation pulse. A rephasing of the first and second coherence curve is possible after the application of the first and second excitation pulses, i.e. after Steps 1001 and 1002, respectively.

In Steps 1003 and 1004 a first and second refocusing pulses are respectively applied and a detection step is implemented. These steps have already been discussed in detail above. The method comes to an end in Step 1005.

Figure 11:
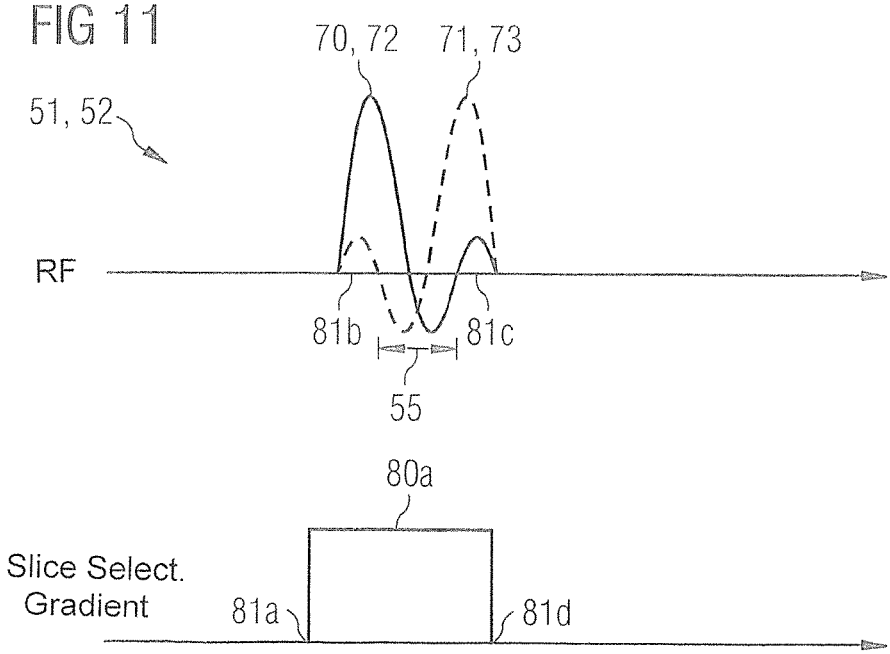
FIG. 11 illustrates an embodiment of the method according to the present invention.

FIG. 11 depicts as an example an embodiment of a method according to the present invention. Radio-frequency pulses (for example excitation pulses 70, 71 or refocusing pulses 72, 73) are hereby respectively applied to a first slice 51 and a second slice 52 that are located in the spatial region of the examined patient 11. First radio-frequency pulses 70, 72 are specifically applied to the first slice 51 (i.e. slice-selectively). Second radio-frequency pulses 71, 73 are slice-selectively applied to the second slice 52. Second radio-frequency pulses 71, 73 are hereby represented by a dashed line. As explained with regard to FIG. 2, for example, in FIG. 11 the time curve is also represented as a horizontal axis. In contrast to Figures discussed in the preceding, the radio-frequency pulses 70, 71, 72, 73 do not exhibit any amplitude modulation in the form of a sinc pulse. The radio-frequency pulses of FIG. 11 have an asymmetrical curve of the amplitude as a function of time. The first difference time period 55 is presented in FIG. 2 as the interval between the maxima of the amplitudes of radio-frequency pulses 70, 71, 72, 73. The maxima of the amplitudes are identified by the points in time 81b and 81c. In particular, given the same first difference time period and the same deflection angle of the magnetization, it is possible to select the necessary maximum amplitude of the radio-frequency pulses to be smaller. Furthermore, the time separation of the first and second radio-frequency pulse that excite the magnetization of the first slice 51 and second slice 52 can be minimized. This has the effect that the corresponding coherence curves have a minimized offset and that the required correction of the coherence curves turns out to be small.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method configured for generating magnetic resonance (MR) images with slice multiplexing, comprising:
   with a control computer, operating an MR data acquisition unit in order to generate a basic magnetic field having a basic field direction, and in order to radiate a first radio-frequency pulse that deflects a first nuclear spin system in a first slice of a subject, thereby giving said first spin system in said first slice a magnetization in a plane that is transverse to said basic field direction in which said magnetization has a phase that exhibits a phase evolution represented as a first coherence curve;
   with said control computer, operating said MR data acquisition unit in order to radiate a second radio-frequency pulse that deflects a second spin system in a second slice of the subject, thereby giving said second spin system in said second slice a magnetization in another plane that is transverse to said basic field direction in which said magnetization has a phase that exhibits a phase evolution represented as a second coherence curve;

with said control computer, controlling operation of said MR data acquisition unit in order to cause a beginning of a second radio-frequency pulse to be time-shifted by a difference time period, with respect to a beginning of said first radio-frequency pulse, that is shorter than a duration of said first radio-frequency pulse;

with said control computer, operating said MR data acquisition unit in order to impress a correction phase on at least one of said first and second spin systems and in order to thereafter detect, in a given signal detection time period, a first signal representing said magnetization of said first nuclear spin system resulting from said deflection of said first nuclear spin system and in order to detect a second MR signal representing said magnetization of said second spin system resulting from said deflection of said second nuclear spin system;

with said control computer, operating said MR data acquisition unit in order to impress said correction phase, whereby each of said first and second coherence curves is rephased thereby causing detection of said first and second MR signals simultaneously in said given signal detection time period; and from said control computer, making the detected first and second MR signals available in electronic form as a data file.

2. A method as claimed in claim one comprising:

with said control computer, setting said difference time period, according to a to at least one of (1) total duration of radiating said first and second radio-frequency pulses and implementing said correction phase and said signal detection time period, (2) an amplitude of said first and second radio-frequency pulses, and (3) a signal strength of said radio-frequency pulses; and with said control computer, selecting said correction phase dependent on at least one of said difference time period, said first coherence curve and said second coherence curve.

3. A method as claimed in claim 1 comprising, with said control computer, operating the MR data acquisition unit in order to radiate each of said first and second radio-frequency pulses with a time curve that is asymmetrical with respect to a point in time of a maximum amplitude of the respective first and second radio-frequency pulses.

4. A method as claimed in claim 1 comprising, with said control computer, impressing at least a portion of said correction phase by a modulation of at least one of said first and second radio-frequency pulses during the respective radiation thereof, said modulation being selected from the group consisting of amplitude modulation and phase modulation.

5. A method as claimed in claim 1 comprising, with said control computer, implementing said phase correction by operating the MR data acquisition unit in order to activate a correction magnetic field gradient.

6. A method as claimed in claim 5 comprising, with said control computer, operating the MR data acquisition unit in order to activate said correction magnetic field gradient with a non-linear spatial dependency.

7. A method as claimed in claim 1 comprising, with said control computer, operating the MR data acquisition unit in order to radiate said first radio-frequency pulse as a first refocusing pulse that generates a spin echo in said first slice, and in order to radiate said second radio-frequency pulse as a second refocusing pulse that generates a spin echo in said second slice.

8. A method as claimed in claim 1 wherein said difference time period is a first difference time period, and comprising, with said control computer, operating the MR data acquisition unit in order to:

excite said first nuclear spin system out of an idle state with said first radio-frequency excitation pulse;

excite said second nuclear spin system out of an idle state with said second radio-frequency excitation pulse; and time shift a beginning of said second radio-frequency excitation pulse by a second difference time period with respect to a beginning of said first radio-frequency excitation pulse.

9. A method as claimed in claim 8 comprising with said control computer, setting said second difference time period to be longer than a duration of said first radio-frequency excitation pulse.

10. A method as claimed in claim 9 comprising, with said control computer, operating the MR data acquisition unit in order to activate a first correction magnetic field gradient between said first and second excitation pulses, and activating a second correction magnetic field gradient between either said second excitation pulse and said refocusing pulses, or after said refocusing pulses and before said detection time period.

11. A method as claimed in claim 8 comprising with said control computer, controlling said MR data acquisition unit to cause said second difference time period to satisfy a criterion selected from the group consisting of said second difference period being twice as long as said first difference time period, and said second difference time period being shorter than a duration of said first radio-frequency excitation pulse.

12. A method as claimed in claim 1 comprising, (b)with said control computer, operating the MR data acquisition unit in order to:

radiate said first radio-frequency pulse and a first refocusing pulse that generates a spin echo in said first slice;

radiate said second radio-frequency pulse and a second refocusing pulse that generates a spin echo in said second slice;

activate a first diffusion refocusing pulse that inverts dephasing of said first spin system;

activate a second diffusion refocusing pulse that inverts dephasing of said second spin system; and time shift a beginning of said second diffusion refocusing pulse by a difference time period with respect to a beginning of said first diffusion refocusing pulse.

13. A method as claimed in claim 12 comprising, with said control computer, setting said difference time period between said second diffusion refocusing pulse in said beginning of said first diffusion refocusing pulse to be identical to said difference time period between said beginning of said second radio-frequency and said beginning of said first radio-frequency excitation pulse.

14. A method as claimed in claim 13 comprising, with said control computer, setting a direction of the time shift of said difference time period between said first and second diffusion refocusing pulses to be identical to a direction of the time shift of said difference time period between said first and second refocusing pulses.

15. A method as claimed in claim 1 comprising, with said control computer, operating the MR data acquisition unit in order to radiate said first radio-frequency pulse as a first excitation pulse that excites said first nuclear spin system out of an idle state, and in order to radiate said second radio-frequency pulse as a second excitation pulse that excites said second nuclear spin system out of an idle state.

16. A magnetic resonance imaging system configured for generating magnetic resonance (MR) images with slice multiplexing, comprising:

an MR data acquisition unit comprising a basic field magnet and a radio-frequency radiator;

a control computer configured to operate said MR data acquisition unit in order to cause said basic field magnet to generate a basic magnetic field having a basic field direction, and in order to radiate a first radio-frequency pulse from said radio-frequency radiator that deflects a first nuclear spin system in a first slice of a subject, thereby giving said first spin system in said first slice a magnetization in a plane that is transverse to said basic field direction in which said magnetization has a phase that exhibits a phase evolution represented as a first coherence curve;

said control computer being configured to operate said MR data acquisition unit in order to radiate a second radio-frequency pulse from said radio-frequency radiator that deflects a second spin system in a second slice of the subject, thereby giving said second spin system in said second slice a magnetization in another plane that is transverse to said basic field direction in which said magnetization has a phase that exhibits a phase evolution represented as a second coherence curve;

said control computer being configured to control operation of said MR data acquisition unit in order to cause a beginning of said second radio-frequency pulse to be time-shifted by a difference time period, with respect to a beginning of said first radio-frequency pulse, that is shorter than a duration of said first radio-frequency pulse;

said control computer being configured to operate said MR data acquisition unit in order to impress a correction phase on at least one of said first and second spin systems, and in order to thereafter detect, in a given signal detection time period, a first signal representing said magnetization of said first nuclear spin system resulting from said deflection of said first nuclear spin system and to deflect a second MR signal representing said magnetization of said second spin system resulting from said deflection of said second nuclear spin system;

said control computer being configured to impress said correction phase in order to cause each of said first and second coherence curves to be rephased whereby detection of said first and second MR signals occurs simultaneously in said given signal detection time period; and said control computer being configured to make the detected first and second MR signals available from said control computer in electronic form as a data file.

* * * * *